United States Patent [19]
Morich et al.

[11] Patent Number: 5,689,189
[45] Date of Patent: Nov. 18, 1997

[54] TECHNIQUE FOR DESIGNING DISTRIBUTED RADIO FREQUENCY COILS AND DISTRIBUTED RADIO FREQUENCY COILS DESIGNED THEREBY

[75] Inventors: Michael A. Morich, Mentor; Labros S. Petropoulos, Solon; Hiroyuki Fujita, Cleveland Heights; Shmaryu Shvartsman, Mayfield Heights; Robert W. Brown, Solon, all of Ohio

[73] Assignee: Picker International, Inc., Highland Heights, Ohio

[21] Appl. No.: 638,203

[22] Filed: Apr. 26, 1996

[51] Int. Cl.$^6$ .................................................. G01V 3/00
[52] U.S. Cl. ............................................. 324/318; 324/322
[58] Field of Search ..................................... 324/318, 319, 324/322, 307, 309, 314; 128/653.5

[56] References Cited

U.S. PATENT DOCUMENTS

| | | | |
|---|---|---|---|
| 4,398,149 | 8/1983 | Zens | 324/319 |
| 5,185,577 | 2/1993 | Ninemura | 324/318 |
| 5,258,717 | 11/1993 | Misic et al. | 324/318 |
| 5,296,810 | 3/1994 | Morich | 324/318 |

OTHER PUBLICATIONS

"Analysis of an MRI Antenna Inside an RF Shield", Ochi, et al., Japanese Journal of Electronics Communication, vol. J76-B-II, pp. 79-85, Feb. 1993.

"A Three Dimensional Analysis of Slotted Tube Resonator for MRI", Chen, et al. IEEE Trans. of Med. Imaging, vol. 13, No. 4, Dec. 1994.

"Calculation of the Signal-to-Noise Ratio for Simple Surface Coils and Arrays of Coils", Wang, et al. IEEE Trans. on Biomed. Eng., vol. 42, No. 9 Sep. 1995.

*Primary Examiner*—Louis M. Arana
*Attorney, Agent, or Firm*—Fay, Sharpe, Beall, Fagan, Minnich & McKee

[57] ABSTRACT

A localized coil (30) is disposed in the temporally constant magnetic field of a magnetic resonance imaging system. The localized coil is designed in five steps: a static problem formulation step, a static current solution step, a discretization step, a current loop connection step, and a high frequency solution step. One radio frequency coil designed by this process to be carried on a circularly cylindrical former includes two coil sections (60, 62) disposed on opposite sides of the dielectric former. Each of the two coil sections includes a pair of inner loops ($64_1$, $64_2$) disposed symmetrically relative to a z=0 plane of symmetry and a second pair of loops ($68_1$, $68_2$) also disposed symmetrically about the plane of symmetry. To raise self-resonance frequency, the inner and outer loops are connected in parallel. The resonance frequency is fine-tuned with reactive elements ($66_1$, $66_2$). To ensure balanced current flow between the two coil portions, the two portions are connected (78) in parallel.

19 Claims, 9 Drawing Sheets

TECHNIQUE FOR DESIGNING DISTRIBUTED RADIO FREQUENCY COILS AND DISTRIBUTED RADIO FREQUENCY COILS DESIGNED THEREBY

BACKGROUND OF THE INVENTION

The present invention relates to the radio frequency signal reception and transmission arts. It finds particular application in conjunction with localized radio frequency coils for magnetic resonance imaging equipment and will be described with particular reference thereto. The invention further relates to the art of designing radio frequency coil structures or flow patterns to meet prescribed field properties such as amplitude, orientation, and spatial variation.

In early magnetic resonance imaging systems, saddle coils were used to create $B_1$ fields for both transmit and receive functions. Typically, two rectangular shaped loops of copper tubing or the like were bent around and mounted to a dielectric cylinder. For optimum uniformity, the rectangular loops commonly subtended an arc of about 120°. The length of the RF coil was about equal to its diameter. Lumped element capacitors were used to tune and match the coil to the selected magnetic resonance frequency.

With properly phased radio frequency current flow through this saddle pair, a symmetric about isocenter $B_x$ field was created, where the effective axis of the loops is along a defined x-direction, orthogonal to y and z-directions. Typically, the axis of the cylinder along which the $B_0$ field lies is defined as the z-direction. A second pair of saddle coils were often tuned to resonate at a like frequency and mounted 90° offset from the first pair of saddle coils to create a $B_y$ field. When this second coil pair was excited with radio frequency currents 90° out of phase with the first saddle coil pair, a circularly polarized radio frequency field was created. This arrangement, called a quadrature radio frequency coil, provided a signal-to-noise ratio advantage in magnetic resonance studies of about 1.4:1 over a linearly polarized coil.

Although such quadrature saddle RF coils provided adequate performance in early commercial magnetic imaging systems, the $B_1$ field suffered from non-uniformity problems, particularly in the transmit mode. Because the soft tissue contrast-to-noise ratio is more important than uniformity in some imaging applications, some non-uniformity of the $B_1$ field could be tolerated for the receive function. However, a principal role of the transmitter coil was to give uniform excitation of all dipoles in the field.

For greater RF uniformity, birdcage coils have become the RF coil of choice in most modern magnetic resonance imaging equipment, particularly for transmission. The birdcage coil improves upon uniformity relative to the saddle coil. Although the birdcage coil has intrinsically high $B_1$ uniformity through its transverse plane, it has relatively few degrees of design freedom. To adapt a birdcage coil to a particular application, its length can be adjusted as can its diameter. Its frequency is, of course, tuned to the resonance frequency and its impedance matched to the rest of the system.

Simple loop coils have been used in various forms to make surface or localized coils for the receive function. Surface coils sit in proximity to the target region of interest and give a high local $B_1$/sensitivity factor for signal-to-noise advantage, but have relatively poor uniformity. Circular and rectangular loop shapes have been used to detect $B_1$ fields along the axis of the loop. Crossed loop pairs, such as Figure-8's, have been used to detect $B_1$ fields orthogonal to the loop axis, particularly in a region of a mid-plane of a pair of crossed coils. By combining loop and crossed-loop shapes, quadrature surface coils, including quadrature planar coils, have been created. In addition to loop-type coils, saddle and birdcage coils have also been adapted as surface receiving coils. The exact configuration of the coils is adapted to provide a close fit to the head, torso, knee, or other imaged anatomical body part.

To improve the signal-to-noise ratio and depth of coverage on larger volume targets, arrays of individually resonant single loop structures have been mounted around a coil form or on multiple coil forms. The sensitivity fall-off of such surface coil arrays can be tolerated, within reason. For example, in spine imaging, a coil array is needed only on the backside of the subject because the spine is not too distant from that surface. To image the abdomen, for example, one needs coils which have penetrating $B_1$ at both the top and bottom sides of the circuit and, preferably, on lateral sides of the subject as well. In general, each element of the array is a single simple loop or a combination of the single loop and a crossed pair to create a locally quadrature field. Loop geometries, again, had only limited degrees of design freedom, typically length or diameter.

In addition to adjusting the size characteristics of the prior art saddle, birdcage, or loop coils, the resonant point of the coil is adjusted. The resonant point of the coil is determined with a network analyzer. A tuning capacitance is adjusted until the resonance frequency matches the selected magnetic resonance frequency. An electrical matching network, commonly a parallel capacitance at the feed point, is used to match the coil to the desired impedance of the magnetic resonance imaging system, e.g., 50 Ohms.

Typically, the saddle, birdcage, and loop coils have been designed by trial and error. The basic configuration of each coil is, of course, known. The relative size of the coils is selected in accordance with the size of the region to be imaged. Various adjustments are often made to the coil, particularly size adjustments, or folding, or bending the coil. Each time the physical properties of the coil are altered, the coil is analyzed to determine its actual characteristics. The adjustments are as reliable as the skill and experience of the designer and are not based on analytic or numerical analysis or guidance.

The present invention provides a new and improved RF coil and design technique which overcomes the above-referenced problems and others.

SUMMARY OF THE INVENTION

In accordance with one aspect of the present invention, a method of magnetic resonance imaging is provided. A temporally constant magnetic field is generated through a cylindrical bore of a magnetic resonance imaging system. A localized coil carries at least a radio frequency coil designed to receive magnetic resonance signals from a region contiguous thereto. A patient and the localized coil are inserted into the bore and magnetic resonance is excited within a portion of the patient contiguous to the localized coil and encoded with magnetic field gradients. The encoded magnetic resonance is received with the localized coil, demodulated, and reconstructed into an image representation. The method further includes designing the radio frequency coil including the following steps. In a static problem formulation step, static coil geometry and vector current density components are defined. In a static current solution step, a set of current density expansion coefficients which define preselected $B_1$ field characteristics of the radio frequency coil are obtained. The set of current density expansion coefficients define a continuous current density function. In a discretization step, the continuous current density function is discretized. In a loop connection step, current loops are defined which mimic the discretized current density function. In a high frequency solution step, current carrying monopoles or V-dipoles are defined along the current loops, reactive elements are added to adjust resonance frequencies and matching characteristics, and a feed point is selected.

In accordance with a more limited aspect of the present invention, the defined radio frequency coil has at least two pair of loops disposed concentrically on opposite sides of a central plane of symmetry.

In accordance with another aspect of the present invention, a magnetic resonance imaging device is provided. A main field magnet generates a temporally constant magnetic field through an examination region. Radio frequency and gradient magnetic field coils generate radio frequency pulses for exciting magnetic resonance of a portion of a subject within the temporally constant magnetic field and encoding the resonance. A receiver demodulates received encoded magnetic resonance signals. A reconstruction processor reconstructs the demodulated magnetic resonance signals into an image representation. A radio frequency coil which at least receives the encoded magnetic resonance signals includes first and second pairs of loops disposed symmetrically to either side of a central plane of symmetry.

In accordance with a more limited aspect of the present invention, additional pairs of loops are provided.

In accordance with yet another more limited aspect of the present invention, a second coil portion is disposed oppositely on a cylinder from the first and second pairs of loops. The second coil portion also includes first and second pairs of current loops disposed symmetrically about the plane of symmetry.

One advantage of the present invention is that it enables RF coils to be designed and built which have a prescribed spatial behavior of the $B_1$ field.

Another advantage of the present invention is that it facilitates the design of multi-turn structures which produce useful $B_1$ field characteristics at relatively high magnetic resonance frequencies, e.g., 64 MHz.

Another advantage of the present invention is that it allows for determination of a proper resonance point in magnetic resonance applications for a radio frequency coil structure with proposed feeding, tuning and matching schemes, and preferably derived from a static or quasi-static inverse solution.

Another advantage of the present invention is that it provides an analytical/numerical technique, as opposed to an experimental procedure, for optimizing $B_1$ coil characteristics.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
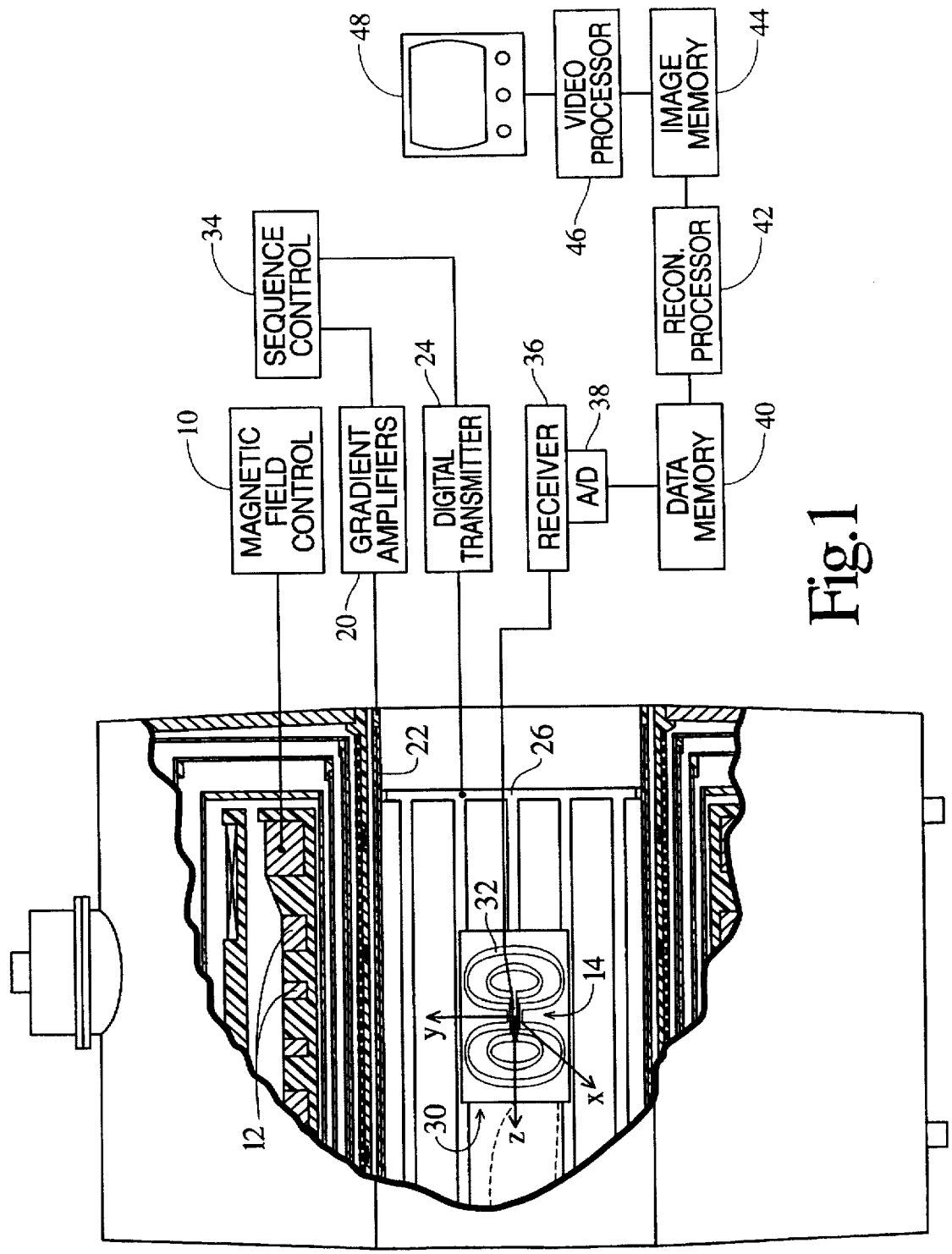
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses to a whole body RF coil 26 to transmit RF pulses into the examination region. Each typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole body applications, the resonance signals can be picked up by the whole body RF coil 26.

For generating images of limited regions of the subject, a surface or localized coil is placed contiguous to the selected region. For example, an insertable head coil 30 is inserted with a selected brain region of interest at the isocenter of the insertable coil. A local, radio frequency coil 32 receives magnetic resonance signals emanating from the region of interest. More specifically, resonance is excited by the radio frequency coil 26 and the resultant magnetic resonance signals are received by the localized radio frequency coil 32. Alternately, the localized coil assembly 30 can include its own gradient coils and an RF shield between the RF and gradient coils. The local radio frequency coil 32 can be connected with the transmitter 24 to operate in both transmit and receive modes.

A sequence control 34 is loaded with a selected magnetic resonance imaging sequence, such as a gradient echo, spin echo, gradient and spin echo, fast spin echo, echo planar imaging, or other magnetic resonance imaging sequence and controls the gradient amplifiers 29 and digital transmitter 24 in accordance therewith. More specifically, the sequence control causes the gradient amplifiers and digital transmitter to create gradient and radio frequency pulses at appropriate times and magnitudes for the selected imaging sequence. The sequence controller is indexed by a clock to step phase-encoding or other variables from repetition to repetition of the selected sequence.

After magnetic resonance is induced, the localized radio frequency coil 32 receives the magnetic resonance imaging signals which are conveyed to a receiver 36. Typically, the magnetic resonance signals received during application of a read gradient are demodulated, digitized 38, and converted into a digital data line or view. The views or digital data lines are typically stored in temporary storage or memory 40 until they are reconstructed by a reconstruction processor 42 into an image representation. The image representation is stored in an image memory 44. Depending on the nature of the selected sequence, the image representation may be a slice image, a volume image, a series of images, or the like. A video processor 46 withdraws selected portions of the image representation and reformats the data in appropriate format to generate a selected display on a monitor 48, such as a CRT, active matrix, CCD, or other conventional video display device.

Figure 2:
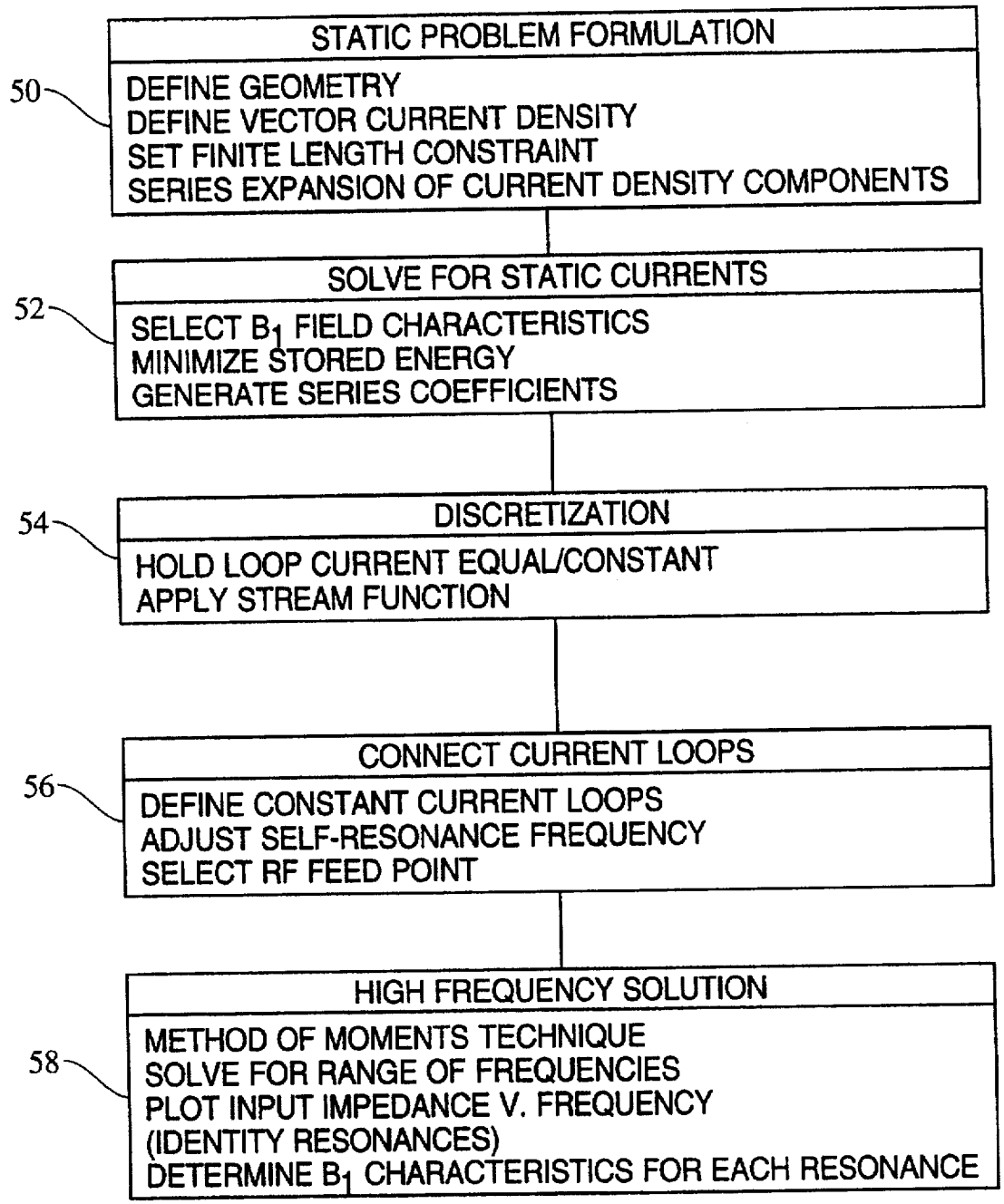
FIG. 2 is a flow chart outlining the radio frequency coil design technique.

With reference to FIG. 2, the RF coil 30 is designed on a theoretical basis using a series of analytical steps to realize a physical distributed RF coil design. First, in a static problem formulation step the static coil geometry and vector current density components are defined. Using the example of a head coil, a circularly cylindrical geometry is selected with current density components $J_\phi$ and $J_z$. Preferably, the coil is constrained to be of a selected, finite length. The current density components are expressed as an expansion series. In the illustrated circularly cylindrical example, Fourier sine and cosine series with unknown expansion coefficients to be determined are advantageous.

Second, a static currents solution step obtains a set of coefficients for the current density component expansion which yields a preselected set of $B_1$ field characteristics. In the preferred embodiment, stored magnetic energy is minimized subject to a set of field constraints. In this manner, techniques previously used for magnetic resonance imaging gradient coil design are adapted to the static $B_1$ field problem.

Third, a discretization step 54 discretizes the continuous current density function. In the preferred embodiment, the current for each loop of wire is held to preselected constraints, and a stream function technique is applied. For simplicity of design, equal, constant loop currents are preferred. However, when multiple feeds are provided to each of a multiplicity of loops or loop segments, a plurality of different loop current values can be assigned.

Fourth, a current loop connection step 56 condenses the current density function into a plurality of discretized coil loops. When all loops are constrained to a constant current, a static solution can be found in which the loops of wire would be connected in series to produce a $B_1$ field which mimics that produced by the continuous current density. However, the self-resonant point of an RF structure is lowered as more turns are added in series. For high field magnetic resonance imaging equipment in which higher resonance frequencies, e.g., 64 MHz are required, the resonance frequency of the RF structure is typically too low.

Accordingly, in the preferred embodiment, to keep the inductance of the structure low, the loops are connected in parallel and impedance elements are distributed in the circuit to obtain a proper distribution of current to each parallel leg, element, and loop of the circuit. An appropriate RF feed point or points are selected. Preferably, the RF feed point or points are selected in accordance with the symmetry of the coil.

Fifth, a high frequency solution step 58 is used to select a magnetic resonance frequency solution. Given the prescribed wire connection scheme, initial lumped elements, and feed point, a method of moments or other full wave field solution technique is applied to study the resonance characteristics of the structure. A solution is obtained at various frequencies in the range of interest, e.g., 10–100 MHz for commercial whole body NMR systems. A feed point input impedance versus frequency (FIG. 3A) is plotted to identify the self resonances. At each self resonance point, the high frequency currents are analyzed to determine which resonance yields a preferred $B_1$ field characteristic, particularly a symmetric $B_1$ about the origin and having uniformity consistent with the constraints. In the preferred embodiment, one searches fir the resonance that gives substantially equal current amplitude in each leg with minimum phase variation along the path of the leg. In this process, one suitably modifies the lumped elements in the circuit to yield the optimal $B_1$ characteristics. At least one lumped element is incorporated and adjusted to match the circuit to the connecting cable characteristic impedance. It should be noted that the other resonance modes may be useable in other applications, such as in examining magnetic resonance signals from other dipoles with different resonance frequencies.

Figure 4:
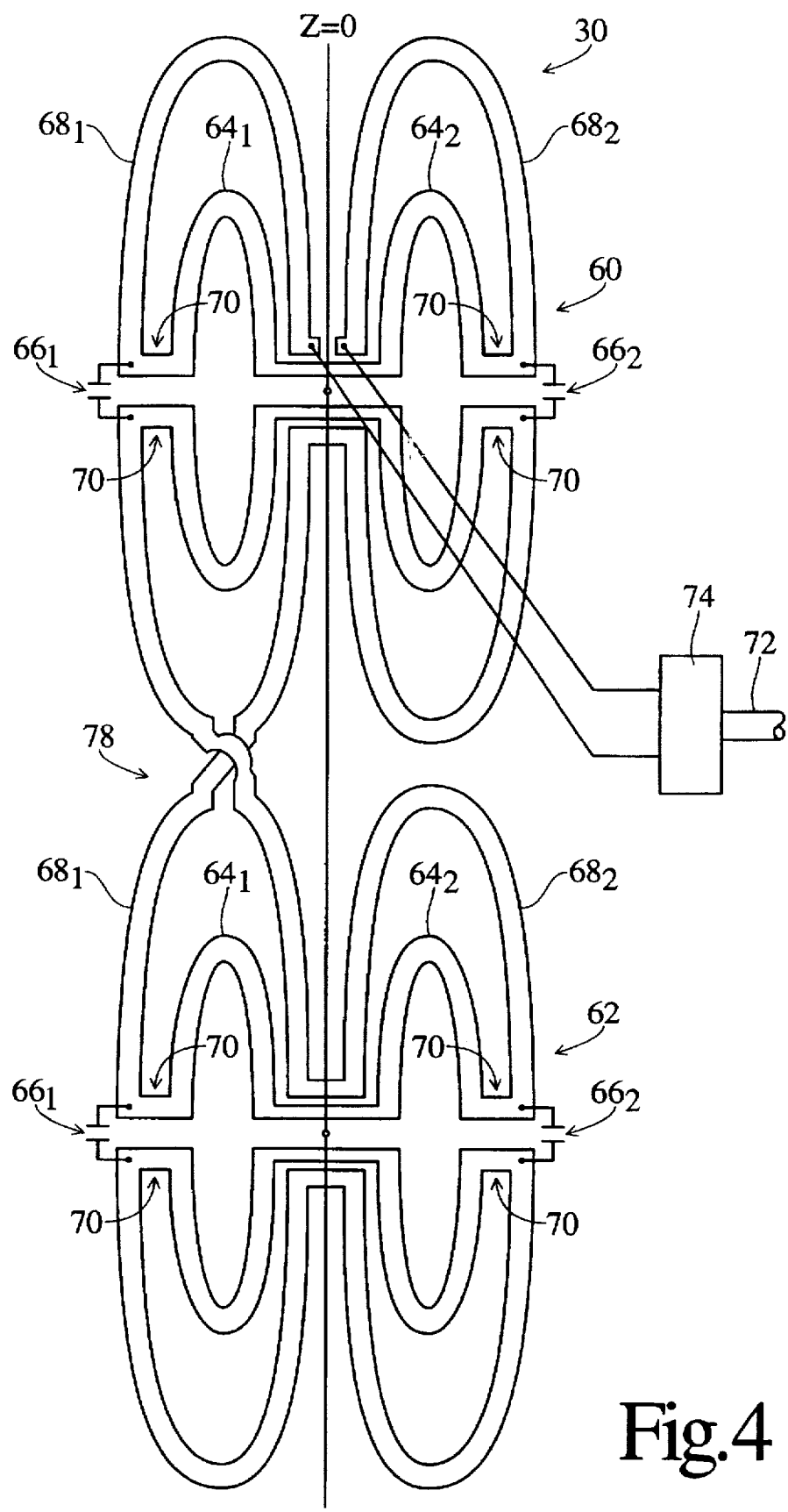
FIG. 4 illustrates a coil pair from the local coil of FIG. 1 laid out flat.

With reference to FIG. 4, a cylindrical winding pattern for the radio frequency coil 32 designed in accordance with the method of FIG. 2 is illustrated. The coil has two coil portions 60, 62 of like construction which are disposed 180° apart on opposite sides of a dielectric cylinder. For simplicity of illustration, portion 60 is described in detail and it will be appreciated that a similar description applies to portion 62. The first coil section includes a double inner loop $64_1$, $64_2$ disposed symmetrically on either side of a central or z=0, plane through the isocenter of the localized coil 30. These loops are completed at their outside edges with a capacitor or other load $66_1$, $66_2$ which adjusts the resonance frequency to a preselected frequency.

The coil portion 60 further includes an outer pair of loops $68_1$, $68_2$ also disposed symmetrically on either side of the central plane. The loops are again completed at their outer edge by the frequency adjusting impedances $66_1$, $66_2$. Connections 70 are provided between the inner and outer loops in order to create a parallel interconnection. The interconnections 70 are direct interconnections but impedances may be used, particularly when a larger number of loops are connected.

A cable 72 extending to the receiver is connected at one end with a matching impedance network 74. The matching impedance network 74 is connected with a pair of symmetric feed points 76. To assure that the current distribution in coil portions 60 and 62 match, the two portions are connected in series by a series interconnection 78.

Looking now in greater detail to the coil design technique discussed above in conjunction with FIG. 2, the mathematical formulation of the energy/inductance optimized radio frequency (RF) coil is viewed as a superposition of two parts. The first part 50, 52, 54 discusses the mathematical development of the energy/inductance minimized static field configuration which satisfies all the symmetry conditions and field qualities that a magnetic field generated by an RF coil is to have. Using the discrete current pattern which is generated in the first part, the second part 56, 58 discusses the mathematical methodology of resonating such a current configuration using the Method of Moments (MOM) technique.

In an axial bore system, one is typically interested in producing RF fields transverse to $\vec{B}_0 = B_0 \hat{z}$, i.e., $B_{1x}$, $B_{1y}$ fields. As an example, a circular cylindrical finite length coil structure is designed below.

The geometrical configuration of the finite length cylindrical RF coil is shown in FIG. 1, where L is the total length of the coil, while a is the coil radius. In order to generate the $B_x$ component of the RF field, the current density distribution is viewed as a vector superposition of two components; one along the axial z-direction and the other along the azimuthal direction. Thus, the general expression of the current density distribution is:

$$\vec{J}^a(\vec{r}) = [j_{\phi(x,z)}\hat{a}_\phi + j_z^a(\phi,z)\hat{a}_z]\delta(\rho - a) \quad (1).$$

The goal is to find the appropriate current density distribution which will generate a static field component along the x-direction with the specified uniformity. Specifically, both components of the current density are to possess certain symmetries, in order to generate a $B_x$ component which is symmetric along the xz, yz, and xy planes. Since we are interested in a finite current distribution and with the help of the continuity equation:

$$(\vec{\nabla} \cdot \vec{J}^a = 0),$$

the expressions for both components of the current density can be written as:

$$j_\phi^a(\phi, z) = \cos\phi \sum_{n=1}^{\infty} c_n \sin k_n z \text{ for } |z| \leq \frac{L}{2}, \quad (2a)$$

$$j_z^a(\phi, z) = \sin\phi \sum_{n=1}^{\infty} \frac{(-c_n)}{k_n a} \cos k_n z \text{ for } |z| \leq \frac{L}{2}, \quad (2b)$$

$$j_z^a(\phi, z) = 0 \text{ for } |z| \frac{L}{2}, \quad (2c)$$

where $c_n$ are the Fourier coefficients, and $$k_n = \frac{(2n-1)\pi}{L}.$$

Because the coordinate system is cylindrical, the $B_x$ component of the RF field can be expressed in terms of radial $B_\rho$ and azimuthal $B_\phi$ components of the magnetic field as:

$$B_x = B_\rho \cos\phi - B_\phi \sin\phi \quad (3).$$

Considering the Fourier transform of the two components of the current density distribution, and using the continuity equation to relate both components in the Fourier domain, the expression of the $B_x$ component of the RF field is:

$$B_x = -\frac{\mu_0 aL}{4\pi\rho} \left[ \sum_{n=1}^{\infty} c_n \int_{-\infty}^{\infty} dk \cos k z K_1'(ka)\psi_n(k), \quad (4) \right.$$

$$\{(k\rho)\cos^2\phi I_0(k\rho) - \cos 2\phi I_1(k\rho)\}]$$

with:

$$\psi_n(k) = \left[ \frac{\sin(k - k_n)\frac{L}{2}}{(k - k_n)\frac{L}{2}} - \frac{\sin(k + k_n)\frac{L}{2}}{(k + k_n)\frac{L}{2}} \right], \quad (5)$$

and $I_{0,1}$, $K_1$ are the modified bessel functions of the first and second order, respectively.

Furthermore, the expression of the stored magnetic energy W is:

$$W = \int_V \vec{A} \cdot \vec{J} d^2x = -\frac{a^2\mu_0 L^2}{16} \sum_{n=1}^{\infty} \sum_{n'=1}^{\infty} c_n c_{n'} \int_{-\infty}^{\infty} dk I_1'(ka) K_1'(ka). \quad (6)$$

$$\psi_n(k)\psi_{n'}(k)$$

The task is to find the current density distribution which generates a $B_x$ component of the RF field according to the constraint equation:

$$B_x(\vec{r}_j) = B_{xSC}(\vec{r}_j) \text{ for } j=1, \ldots, N \quad (7),$$

where $B_{xSC}(\vec{r}_j)$ is the constraint value of $B_x$ at the point $\vec{r}_j$ and N is the number of constraint points.

In order to achieve this, the energy minimization mechanism is employed as applied for gradient coil design (U.S. Pat. No. 5,296,810 to Morich) and construct the functional $\xi$ as:

$$\xi(c_n) = W - \sum_{j=1}^{N} \lambda_j(B_x(\vec{r}_j) - B_{xSC}(\vec{r}_j))$$

Minimizing $\xi$ with respect to $c_n$, a matrix equation for $c_n$, for every n becomes:

$$\sum_{n'=1}^{\infty} c_{n'} \left\{ -\frac{aL\pi}{2} \int_{-\infty}^{\infty} dk I_1'(ka) K_1'(ka)\psi_{n'}(k)\psi_n(k) \right\} = \quad (8)$$

$$\sum_{j=1}^{N} \lambda_j \frac{1}{\rho} \int_{-\infty}^{\infty} dk \cos k z_j K_1'(ka)\psi_n(k)$$

$$[(k\rho)\cos^2\phi I_0(k\rho) - \cos 2\phi I_1(k\rho)].$$

Using a compact matrix notation and putting an upper threshold (M) to the infinite summations, Equation (8) becomes:

$$\sum_{n'=1}^{M} c_{n'} C_{n'n} = \sum_{j=1}^{N} \lambda_j D_{jn} \to \underline{J}^a \underline{C} = \underline{\lambda D} \text{ or } \underline{J}^a = \underline{\lambda D C}^{-1}. \quad (9)$$

Employing the constraint equation, the final matrix solution for the continuous current distribution is given by:

$$\underline{J}^1 = \underline{B}_x [\underline{DC}^{-1} \underline{D}^T]^{-1} \underline{DC}^{-1} \quad (10),$$

where $\underline{B}_x$ is the matrix representation of the field constraint points and $^T$ denotes the transpose of the matrix.

Thus, employing the energy minimization mechanism defines the continuous current distribution which generates the desired field behavior for the $B_x$ component. Discretizing the continuous current density using the stream function technique (see U.S. Pat. No. 5,296,810 to Morich), one obtains the discrete current pattern which is a close approximation of the continuous current density behavior. In order to validate the energy minimization mechanism independently, the $B_x$ component of the RF field is re-evaluated by employing the Biot-Savart law to the discrete loop pattern.

We now proceed with the design of the first prototype RF coil. The radius of the coil is chosen by way of example to be a=15.25 cm, while the length of the coil is L=30 cm. Preferably, three constraint points are used in order to define the quality of the $B_x$ component inside a 20 cm Diameter Spherical Imaging Volume (DSIV). The first constraint point sets the magnitude of the x-component to 23.5 µT. The second constraint defines the on-axis variation of the magnetic field to within 10% from its ideal value and at a distance of 10 cm from the center of the RF coil. The final constraint limits the off-axis variation of the x component of the magnetic field to a highest of 30% at the borders of the 20 cm DSIV. This set of constraints are displayed in TABLE 1.

TABLE 1

| n | $\rho_i$ | $z_i$ | $B_x sc$ |
|---|---|---|---|
| 1 | 0.001 | 0.000 | 0.000023500 |
| 2 | 0.100 | 0.000 | 0.0000211500 |
| 3 | 0.001 | 0.100 | 0.000017000 |

Figure 5A:
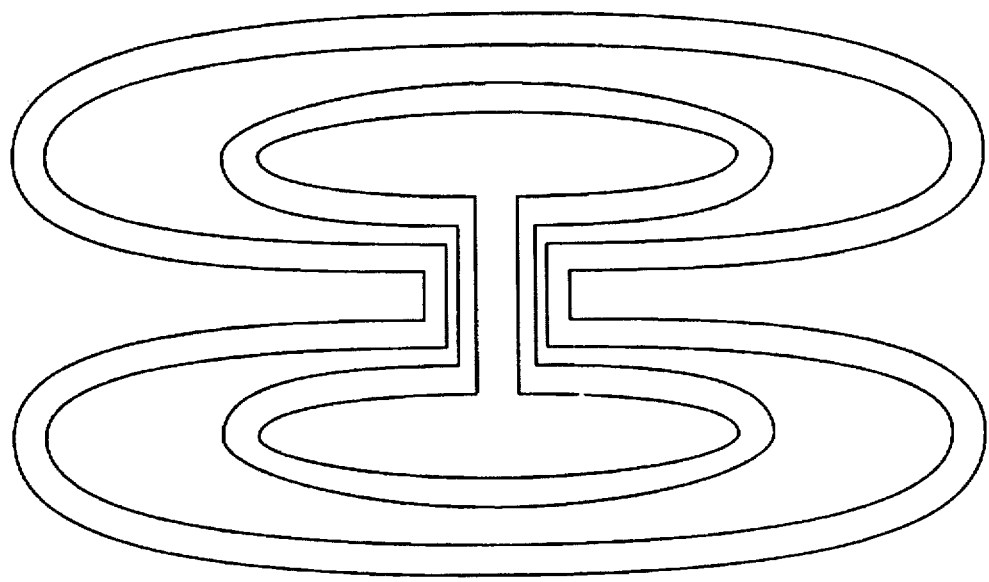
FIGS. 5A and 5B are two and four loop solutions generated by the present design technique.
Figure 5B:
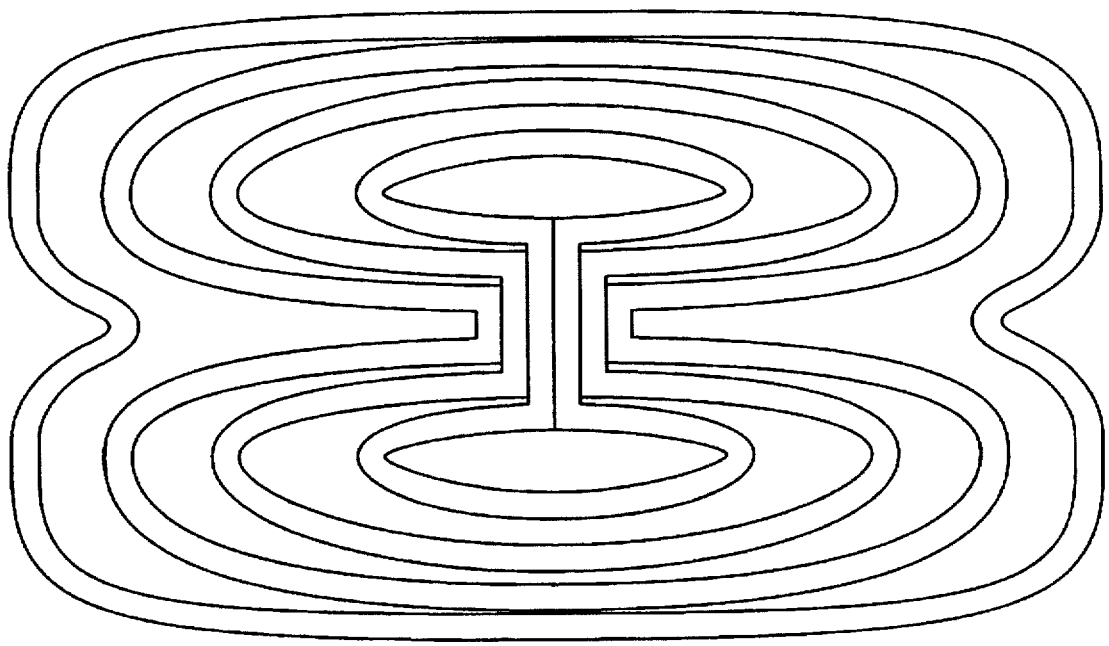

Employing the energy minimization approach, the continuous current density is obtained for the linear $B_x$ mode of the RF coil. FIGS. 5A and 5B show a two and four discrete loop pattern, respectively.

The theoretical basis for the electromagnetic analysis is the solution of Maxwell's equations for the electric field expressed in terms of the vector and scalar potentials. All wavelength and time dependence is taken into consideration. The Lorentz gauge condition is used to eliminate the scalar potential, and with harmonic time dependence, the electric field is written:

$$\vec{E}^{scat}(\vec{r}) = \frac{-i\mu}{4\pi\omega\epsilon_0} \int_C [\nabla(\nabla_{\vec{r}'} \cdot \vec{I}(\vec{r}')\psi(\vec{r},\vec{r}')) + \beta^2 \vec{I}(\vec{r}')\psi(\vec{r},\vec{r}')] dl, \quad (11)$$

where $\psi(\vec{r},\vec{r}')$ is the three-dimensional free-space Green function:

$$\psi(\vec{r},\vec{r}') = \frac{e^{-i\beta R}}{4\pi R}, \quad (12)$$

where R is the distance between the observation point $\vec{r}$ and the source point $\vec{r}'$, $\vec{I}(\vec{r}')$ the current vector, and $\beta$ a wave number. The integration is performed along the current path C.

For materials with high conductivity, the general condition:

$$\vec{E}^{scat}(\vec{r}) + \vec{E}^{inc}(\vec{r}) = 0, \quad (13)$$

can be used to good approximation on the surfaces and inside of the conductors. In the present application, the condition implies that the sum of the scattered field and the incident field vanishes at the surface of the perfectly conducting wire and also interior to the wire. This leads to Pocklington's integral equation:

$$\frac{-i\mu}{4\pi\omega\epsilon_0} \int_C [\nabla(\nabla_{\vec{r}'} \cdot \vec{I}(\vec{r}')\psi(\vec{r},\vec{r}')) + \beta^2 \vec{I}(\vec{r}')\psi(\vec{r},\vec{r}')] dl = -\vec{E}^{inc}(\vec{r}). \quad (14)$$

The current $\vec{I}(\vec{r}')$ in the above expression is the unknown function to be found.

The method of moments is utilized to reduce Pocklington's integral equation for wire segments to a system of simultaneous linear algebraic equations in terms of the unknown current. The conducting body is modeled by an approximation in which it is subdivided into wire segments (monopoles). The approximation is made as accurate as necessary by increasing the number of such monopoles. Any two consecutive monopoles are defined as a V-shaped dipole over which a testing function is defined, satisfying the boundary condition that the current vanishes at both ends of the dipole. The n-th testing function is non-zero only when the V-shaped dipole corresponds to the n-th V-shaped dipole, and zero otherwise. The testing function of choice is $\vec{W}_n(\vec{r})$, the n-th piecewise sinusoidal testing function are defined by:

$$\vec{W}_n(\vec{r}) = \begin{cases} \frac{\sin\beta(\hat{l}_{n-1} \cdot (\vec{r} - \vec{r}_{n-1}))}{\sin\beta(\hat{l}_{n-1} \cdot (\vec{r}_n - \vec{r}_{n-1}))} \hat{l}_{n-1}, \vec{r}\epsilon\vec{l}_{n-1} \\ \frac{\sin\beta(\hat{l}_n \cdot (\vec{r}_{n+1} - \vec{r}))}{\sin\beta(\hat{l}_n \cdot (\vec{r}_{n+1} - \vec{r}_n))} \hat{l}_n, \vec{r}\epsilon\vec{l}_n \end{cases} \quad (15)$$

$\vec{l}_{n-1}$ is the vector connecting the two points $\vec{r}_{n-1}$ and $\vec{r}_n$, and $\vec{l}_n$ the vector connecting the two points, $\vec{r}_n$ and $\vec{r}_{n+1}$. $\hat{l}_{n-1}$ and $\hat{l}_n$ are the unit vectors along the n-th V-shaped dipole. The current $\vec{I}(\vec{r}')$ is expanded in terms of the testing function:

$$\vec{I}(\vec{r}) = \sum_{n=1}^{N} I_n \vec{W}_n(\vec{r}), \quad (16)$$

where the $I_n$ is the unknown current coefficient.

The expansion of the electric field $\vec{E}^{inc}(\vec{r})$ is made in terms of the same set of testing functions procedure, corresponding to an implementation of Galerkin's method with Richmond-Schelkunoff's piecewise sinusoidal bases.

The substitution of the expansions into Equation (4) yields a linearized problem:

$$\sum_{n=1}^{N} Z_{mn} I_n = V_m, \quad (17)$$

where $Z_{mn}$ is the generalized impedance matrix between segments m and n (m, n=1, ..., N), $$Z_{mn} = \int_{(\vec{r}_{m-1},\vec{r}_m,\vec{r}_{m+1})} \vec{W}_m(\vec{r}) \cdot \vec{E}_n^{scat}(\vec{r}) dl, \quad (18)$$

and the m-th generalized voltage matrix element is:

$$V_m = -\int_{(\vec{r}_{m-1},\vec{r}_m,\vec{r}_{m+1})} \vec{W}_m(\vec{r}) \cdot \vec{E}^{inc}(\vec{r}) dl. \quad (19)$$

The expression for $\vec{E}_n^{scat}(\vec{r})$ is obtained from Equation (11) by the substitution:

$$\vec{I}(\vec{r}) \rightarrow \vec{W}_n(\vec{r}).$$

The integrations in Equations (18) and (19) are performed along the m-th V-shaped dipole. The voltage matrix elements $V_m$ are determined by the location of the external power source. They are scaled to unit value if the corresponding dipoles are directly connected to the source; otherwise they are set to zero. This approximation assumes a delta function for the incident electric field $\vec{E}^{inc}(\vec{r})$, and the numerical results for it are accurate for the frequencies and the voltage gaps considered.

The unknown current coefficients are obtained by inverting the linear matrix problem of Equation (17):

$$I_n = \sum_{m=1}^{N} (Z^{-1})_{nm} V_m. \quad (20)$$

The magnetic field behavior and the effective circuit impedance for circuit analysis is found following the current calculation.

Applying this solution to the dimensions of an exemplary RF coil system are as follows. The set of V-shaped dipoles are chosen for wire radii of 1.5 mm and subject to the restriction that the lengths of the V-shaped dipoles are less than or equal to 20% of the wavelength. The current pattern for the coil is specified by one quadrant out of the full plane of the current surface, in view of its symmetry. The number of coordinates of the optimized wire paths in the first quadrant may be reduced to 25 points, in order to handle the numerical demands for the $Z_{mn}$ inverse-matrix computations, but maintaining accurate current patterns. The radius of the coil is 0.1525 m, and the length 0.3 m. The current paths, connections, and feed locations are shown in FIG. 4. The number of testing functions for the total system is 206.

Lumped capacitors $66_1$, $66_2$ are distributed over the current tracings to tune the system to the desired frequency. The coil frequency spectrum is determined by calculation of the coil input impedance:

$$Z_{input} = \frac{V_{input}}{I_{input}}. \quad (21)$$

The insertion of a tuning capacitor (capacitance C) implies the diagonal matrix element $Z_{mm}$ associated with the m-th V-shaped dipole is altered by:

$$Z_{mm}' = Z_{mm} - \frac{i}{\omega C}. \quad (22)$$

In addition, the input impedance 74 is adjusted to the impedance of the external source. A matching capacitor (capacitance $C_F$) is used, and the input current $I_{input}$ is modified by:

$$I_{input}' = I_{input} + i\omega C_F V_{input} \quad (23).$$

Figures 3A, 3B:
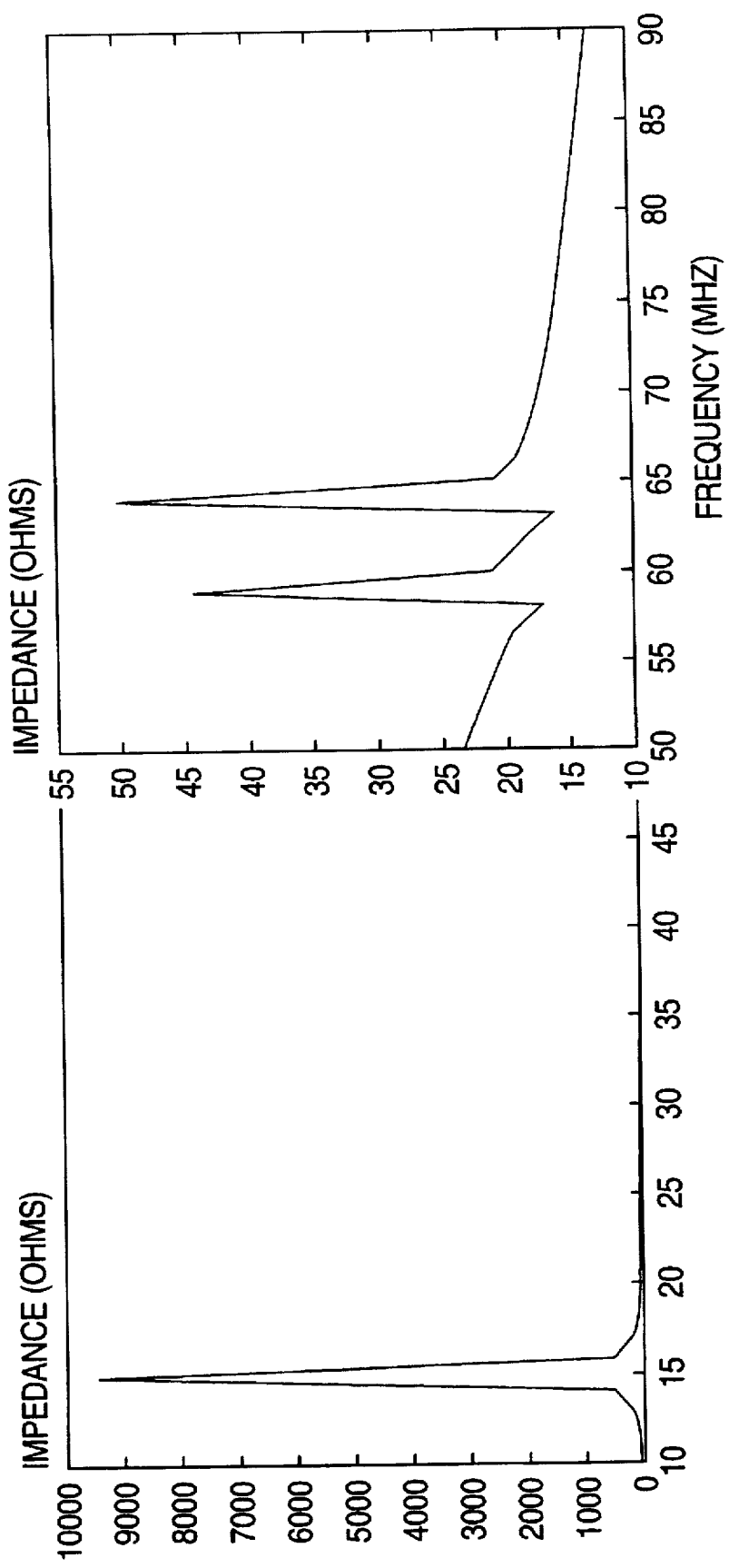
FIGS. 3A and 3B taken together are a plot of feed point input impedances versus frequency.
Figure 6A:
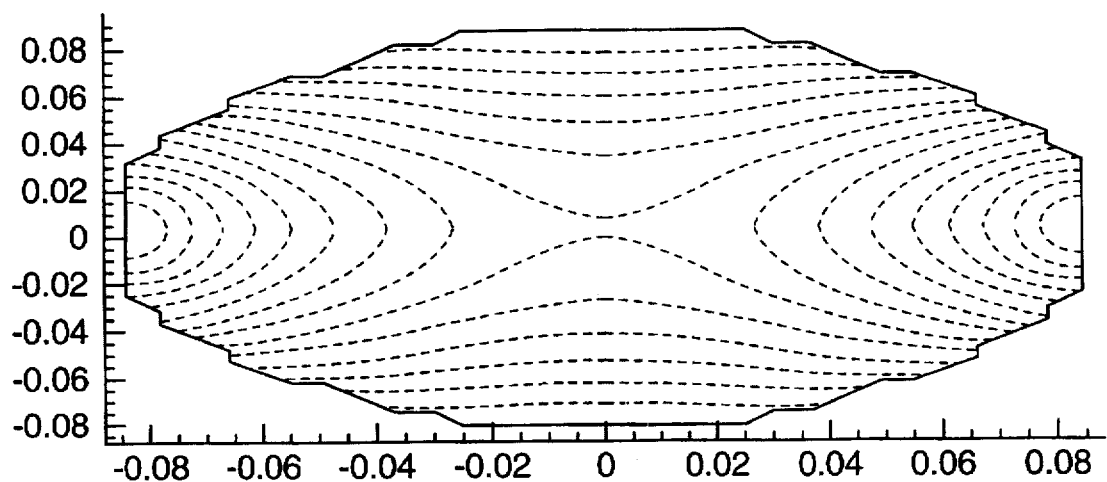
FIG. 6A illustrates the spatial characteristics of the coil of FIG. 4 across the plane of symmetry.
Figure 6B:
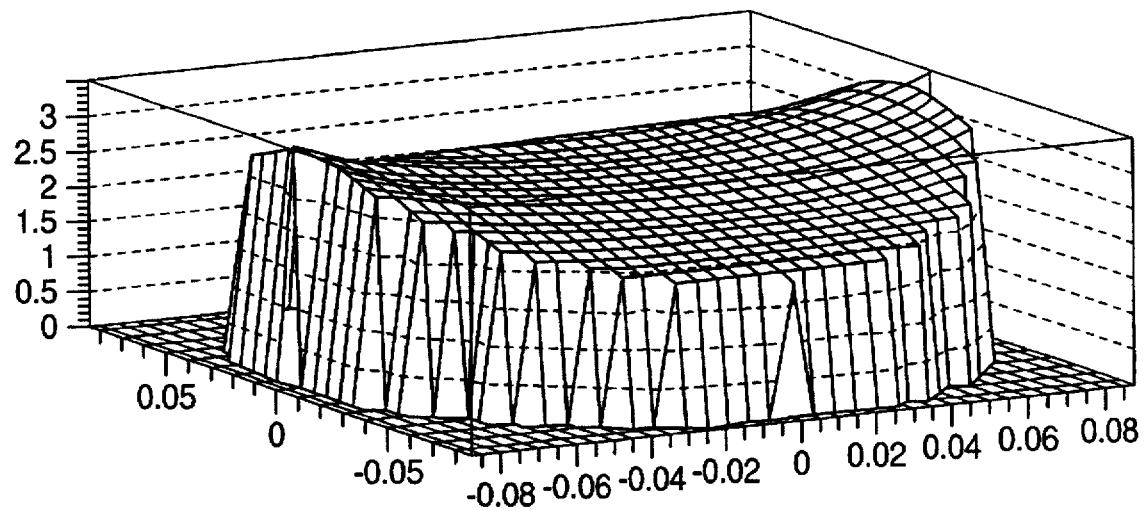
FIG. 6B is a three-dimensional representation of the spatial characteristics of the coil of FIG. 4.

The magnetic field is evaluated by a quasi-static Biot-Savart calculation, since the capacitive distribution has been designed to generate currents with relatively constant phases. The field is examined at each resonant frequency found in the aforesaid input-impedance frequency spectrum as shown in FIG. 3B. For the tuning scheme, the matching capacitance is chosen to be $C_F$=100 pF to begin with, and the tuning capacitances C are varied from 20 pF to 30 pF in the frequency range of 10 MHz to 100 MHz. As seen from the spectrum, the system resonates at 64 MHz, which is the third resonant peak counting upward from 10 MHz, when C is 23 pF. When resonance at 64 MHz is achieved, the resulting linear mode $B_x$ of the RF coil is re-evaluated to see that it has spatial characteristics consistent with the static solution (FIGS. 6A and 6B). The input impedance must be adjusted to match the external electronics. It was found that the change in the capacitance value of $C_F$ is not sensitive to the resonant frequencies. Thus, $C_F$ was adjusted to 142 pF with $Z_{input}$=50.27 Ω while maintaining the resonant nature of the system.

Based on the results of the Method of Moments theory, Cu foil is etched with the pattern of the proposed RF coil and attached into a 29 cm diameter acrylic former. The coil resonates at 63.725 MHz using 28 pF tuning capacitors. The reflection coefficient is −13 dB when the coil is unloaded and −29 dB when the coil is loaded. As a next step, the coil is inserted into a 1.5 T whole body MRI unit. The coil is operated in a transmit as well as receive mode configuration in the same experiment. The MRI sequences used with the coil include a spin-echo (SE) sequence with TE=30 msec. and TR=50 msec. and FOV=25 cm.

Figure 7:
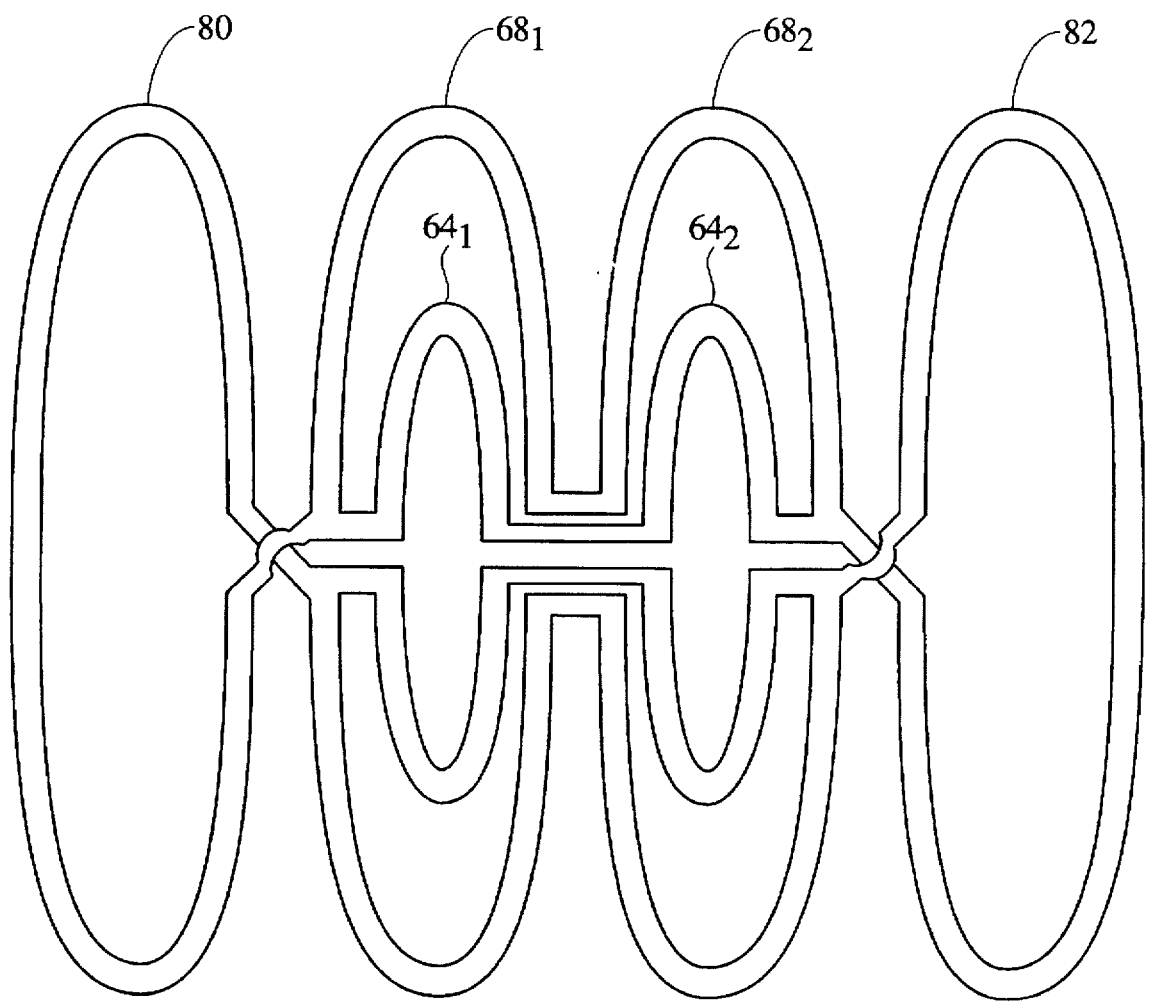
FIG. 7 is another alternate embodiment of the radio frequency coil construction of FIG. 4, but with a sharp drop-off in coil sensitivity at its longitudinal edges.
Figure 8:
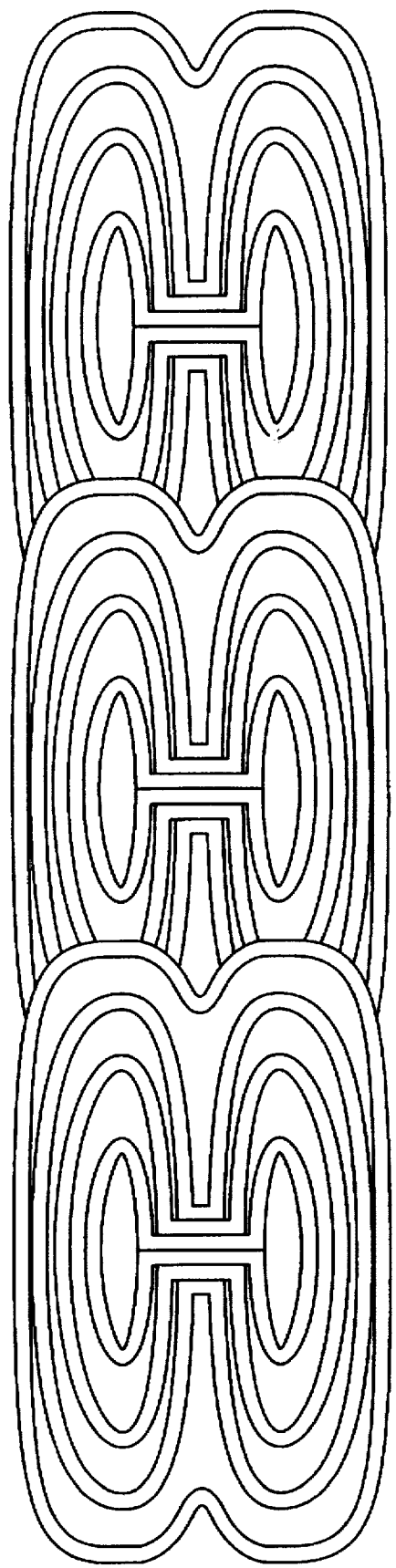
FIG. 8 is another alternate embodiment of a radio frequency coil construction in accordance with the present invention, particularly adapted to planar coils; and, FIG. 9 illustrates shape changes in the coils loop as the region of interest is covered more uniformly.

With reference to FIG. 7, in some applications it is advantageous to limit the sensitivity of the coil along the z or axial direction. When constraints are placed on the design such that the coil sensitivity falls off rapidly at the end of the coil, counter-rotating coil sections 80, 82 are added to the ends of the coil. The counter-rotating sections carry currents in an opposite direction of rotation from coils 64 and With reference to FIG. 8, the coil need not be constrained to lie on a circularly symmetrical cylinder. Rather, the coil can be constrained to other shapes such as oval cylinders, D-shaped cylinders, planes, shapes which conform to various segments of the body, and the like. When the currents are constrained to lie on a plane, the windings take on the distribution shown in FIG. 8.

Figure 9:
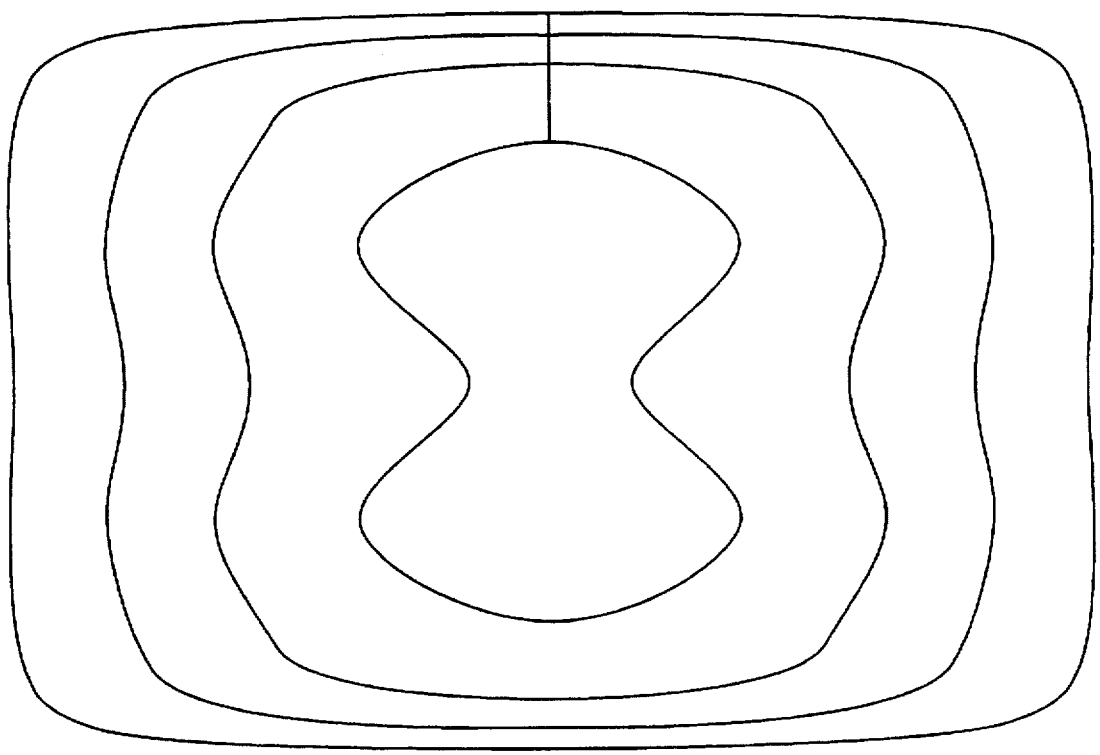

When the four loop coil of FIG. 5B is constrained to become more uniform along the central plane, the coil becomes more squared off at the corners as illustrated in solid line in FIG. 9.

Various alternate embodiments will immediately suggest themselves to those of ordinary skill in the art. Although described with reference to cylindrical bore magnets, the same design techniques can be utilized to design radio frequency coils for use with other types of magnets, such as C-magnets. Rather than connecting the coils in parallel, each of the coils can be tuned and matched with independent pickups to form an array coil structure. Currents in some legs of the coil can be permitted to be different from those flowing in other legs. A second coil of like construction can be mounted 90° rotated on the cylinder to make a cylindrical quadrature coil. Quadrature coils can also be designed for planar, biplanar, elliptical, and other geometries. The coils can also be used in transmit modes, using all or a portion of the loops. In the multiple loop embodiments, the multiple loops can be connected in parallel and the parallel arrangement separately fed from other individual or multiple loops of the structure. It will further be appreciated that in some embodiments, negative or counter-rotating current loops will be called for. Such loops are advantageously formed as a closed circuit so as to create the required counter-flowing currents according to Lenz's law.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of magnetic resonance imaging in which a temporally constant magnetic field is generated through a cylindrical bore of a magnetic resonance imaging system, a localized coil which carries at least a radio frequency coil designed to receive magnetic resonance signals from a region contiguous thereto, a patient and the localized coil are inserted into the bore, magnetic resonance is excited within a portion of the patient contiguous to the localized coil and encoded with magnetic field gradients, the encoded magnetic resonance is received with the localized coil, demodulated, and reconstructed into an image representation, the method further comprising designing the radio frequency coil including:

- a static problem formulation step in which static coil geometry and vector current density components are defined;
- a static current solution step in which a set of current density expansion coefficients which define preselected $B_1$ field characteristics of the radio frequency coil are obtained, the set of current density expansion coefficients defining a continuous current density function;
- a discretization step in which the continuous current density function is discretized;
- a loop connection step in which current loops are defined which mimic the discretized current density function; and,
- a high frequency solution step in which current carrying monopoles or V-dipoles are defined along the current loops, reactive elements are added to adjust resonance frequencies and matching characteristics, and a feed point from which received resonance signals are conveyed for demodulation and reconstruction is selected.

2. The method as set forth in claim 1 wherein in the loop connection step, at least one coil portion is defined, the coil portion having at least two pair of loops disposed symmetrically on opposite sides of a central plane of symmetry of the localized coil.

3. The method as set forth in claim 2 wherein the high frequency solution step further includes connecting the loop pairs on each side in parallel to raise the resonance frequency of the coil.

4. The method as set forth in claim 1 wherein the static problem formulation step includes:

defining a localized coil geometry;

defining a vector current density;

setting finite length constraints on the localized coil; and, series expanding components of the current density.

5. The method as set forth in claim 1 wherein the static current solution step includes:

selecting the characteristics of the $B_1$ field;

minimizing stored energy in the localized coil;

generating series coefficients for the current density expansion.

6. The method as set forth in claim 1 wherein the discretization step includes:

holding the loop current equal and constant; and, applying a stream function to the current density.

7. The method as set forth in claim I wherein the loop connection step includes:

defining constant current loops;

adjusting a self-resonant frequency of the radio frequency coil; and, selecting at least one RF feed point.

8. The method as set forth in claim 1 wherein the high frequency solution step includes:

using a method of moments technique to analyze the resonance characteristics of the radio frequency coil;

solving the method of moments for a range of frequencies;

plotting input impedance versus frequency to identify self-resonances of the radio frequency coil;

determining $B_1$ field characteristics for each identified self-resonance;

selecting at least one of the identified self-resonances which has $B_1$ field characteristics most like the preselected $B_1$ field characteristics; and, adjusting the self-resonance frequency of the selected self-resonance to a preselected self-resonance frequency.

9. The method as set forth in claim 1 wherein the radio frequency coil has a plurality of winding sections, each section having a plurality of loops disposed symmetrically thereon.

10. The method as set forth in claim 9 wherein the plurality of loops includes at least one pair of counter-rotating loops disposed adjacent edge regions for passing current in a counter-rotating direction relative to other loops.

11. The method as set forth in claim 9 further including connecting two of the winding sections in series.

12. A magnetic resonance imaging device which includes a main field magnet which generates a temporally constant magnetic field through an examination region, gradient magnetic fields coils which generate gradient magnetic field pulses for encoding magnetic resonance signals, a radio frequency coil for receiving the encoded magnetic resonance signals, a receiver which demodulates the received encoded magnetic resonance signals, and a reconstruction processor which reconstructs the demodulated magnetic resonance signals into an image representation, the radio frequency coil including:

- a first pair of loops disposed symmetrically to either side of a central plane of symmetry; and,
- a second pair of loops disposed symmetrically to either side of the plane of symmetry, the first and second pairs of loops are connected in parallel.

13. The magnetic resonance imaging device as set forth in claim 12 wherein the radio frequency coil further includes:

- a third pair of electrically conductive loops disposed symmetrically to either side of the plane of symmetry; and,
- a fourth pair of loops disposed symmetrically to either side of the plane of symmetry, the third and fourth pairs of loops being connected electrically in parallel.

14. A magnetic resonance imaging system in which a main field magnet generates a temporally constant magnetic field through an examination region, gradient magnetic field coils generate magnetic field gradients for encoding magnetic resonance signals, a radio frequency coil at least receives the encoded magnetic resonance signals, a receiver demodulates received encoded magnetic resonance signals, and a reconstruction processor reconstructs the demodulated magnetic resonance signals into an image representation, the radio frequency coil including:

- a first pair of loops disposed symmetrically to either side of a central plane of symmetry;
- a second pair of loops disposed symmetrically to either side of the plane of symmetry; and,
- distributed impedances connected in the current loops for adjusting a self-resonant frequency of the radio frequency coil.

15. The magnetic resonance imaging system as set forth in claim 14 further including a second coil portion disposed oppositely on a cylinder from the first and second pairs of loops, the second coil portion including first and second pairs of current loops disposed symmetrically about the plane of symmetry.

16. The magnetic resonance imaging system as set forth in claim 15 wherein the first and second coil portions are connected electrically in series.

17. A magnetic resonance imaging system including a main field magnet which generates a temporally constant magnetic field through an examination region, a radio frequency coil, a gradient magnetic field coil, a receiver which demodulates magnetic resonance signals received by the radio frequency coil, and a reconstruction processor which reconstructs the demodulated magnetic resonance signals into an image representation, the radio frequency coil including:

a first coil portion including at least two pairs of loops disposed symmetrically to either side of a central plane of symmetry and a second pair of loops disposed symmetrically to either side of the plane of symmetry;

a second coil portion disposed oppositely on a cylinder from the first coil portion, the second coil portion including at least two pairs of current loops disposed symmetrically about the plane of symmetry;

the first and second coil portions being connected electrically in series; and the pairs of loops within the first and second coil portions being connected electrically in parallel.

18. A magnetic resonance imaging system including a main field magnet which generates a temporally constant magnetic field through an examination region, a radio frequency coil, a gradient magnetic field coil, a receiver which demodulates magnetic resonance signals received by the radio frequency coil, .and a reconstruction processor which reconstructs the demodulated magnetic resonance signals into an image representation, the radio frequency coil including:

a first pair of loops disposed symmetrically to either side of a central plane of symmetry;

a second pair of loops disposed symmetrically to either side of the plane of symmetry;

a third pair of electrically conductive loops disposed adjacent the first and second pairs and symmetrically about the plane of symmetry, the third pair of loops being interconnected with the first and second pairs of current loops such that current is carried through the third pair of current loops in an opposite direction relative to the most closely adjacent current loops of the first and second pairs.

19. A magnetic resonance imaging device in which a main field magnet generates a temporally constant magnetic field through an examination region, gradient magnetic field coils encode magnetic resonance signals, a radio frequency coil at least receives the encoded magnetic resonance signals, a receiver demodulates the received encoded magnetic resonance signals, a reconstruction processor reconstructs the demodulated magnetic resonance signals into an image representation, the radio frequency coil including:

at least two coil loops disposed on one side of a cylindrical surface symmetrically with respect to a plane of symmetry, the at least two coil loops being connected in parallel;

at least two more coil loops disposed on an opposite side of the cylindrical surface symmetrically with respect to the plane of symmetry, the at least two more coil loops being connected in parallel.

* * * * *